United States Patent
Miller et al.

(10) Patent No.: US 7,012,438 B1
(45) Date of Patent: Mar. 14, 2006

(54) METHODS AND SYSTEMS FOR DETERMINING A PROPERTY OF AN INSULATING FILM

(75) Inventors: Thomas G. Miller, Sunnyvale, CA (US); Gregory S. Horner, Santa Clara, CA (US); Amin Samsavar, San Jose, CA (US); Zhiwei Xu, Sunnyvale, CA (US); Patrick Stevens, Norman, OK (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 185 days.

(21) Appl. No.: 10/616,086

(22) Filed: Jul. 9, 2003

Related U.S. Application Data

(60) Provisional application No. 60/394,835, filed on Jul. 10, 2002.

(51) Int. Cl.
*G01R 27/08* (2006.01)
*G01R 27/26* (2006.01)
*G01N 27/60* (2006.01)

(52) U.S. Cl. .................. 324/716; 324/678; 324/452
(58) Field of Classification Search ............ 324/716, 324/765, 678, 452; 702/84, 65
See application file for complete search history.

(56) References Cited

U.S. PATENT DOCUMENTS

| | | | | |
|---|---|---|---|---|
| 3,715,656 A | * | 2/1973 | Hyde et al. | 324/659 |
| 3,995,216 A | * | 11/1976 | Yun | 324/765 |
| 4,460,866 A | * | 7/1984 | Feuerbaum et al. | 324/649 |
| 4,599,558 A | | 7/1986 | Castellano, Jr. et al. | 324/752 |
| 4,812,756 A | * | 3/1989 | Curtis et al. | 324/750 |
| 5,485,091 A | | 1/1996 | Verkuil | 324/455 |
| 5,498,974 A | * | 3/1996 | Verkuil et al. | 324/767 |
| 5,594,247 A | | 1/1997 | Verkuil et al. | 250/326 |
| 5,644,223 A | | 7/1997 | Verkuil | 324/158.1 |
| 5,650,731 A | | 7/1997 | Fung et al. | 324/751 |
| 5,767,693 A | | 6/1998 | Verkuil et al. | 324/767 |
| 6,011,404 A | * | 1/2000 | Ma et al. | 324/765 |
| 6,097,196 A | | 8/2000 | Verkuil et al. | 324/750 |
| 6,202,029 B1 | | 3/2001 | Verkuil et al. | 702/64 |
| 6,486,682 B1 | * | 11/2002 | Wang et al. | 324/671 |
| 6,600,333 B1 | | 7/2003 | Martin et al. | 324/765 |
| 6,665,623 B1 | * | 12/2003 | Pasadyn et al. | 702/84 |
| 6,791,310 B1 | * | 9/2004 | Smith | 324/765 |

OTHER PUBLICATIONS

*Numerical Recipes in C, The Art of Scientific Computing*, 2nd Ed., © Cambridge University Press 1988, 1992, p. 683.

(Continued)

*Primary Examiner*—Anjan Deb
(74) *Attorney, Agent, or Firm*—Ann Marie Mewherter; Daffer McDaniel, LLP

(57) ABSTRACT

A method for determining a property of an insulating film is provided. The method may include obtaining a charge density measurement of the film, a surface voltage potential of the film relative to a bulk voltage potential of the substrate, and a rate of voltage decay of the film. The method may also include determining the property of the film using the charge density, the surface voltage potential, and the rate of voltage decay. A method for determining a thickness of an insulating film is provided. The method may include depositing a charge on the film, measuring a surface voltage potential of the film relative to a bulk voltage potential of the substrate, and measuring a rate of voltage decay of the film. The method may also include determining a thickness of the film using the rate of voltage decay and a theoretical model relating to leakage and film thickness.

30 Claims, 7 Drawing Sheets

OTHER PUBLICATIONS

Weinberg, "Tunneling of Electrons from Si into Thermally Grown $SiO_2$," Solid-State Electronics, 1977, vol. 20, pp. 11-18.

Verkuil, "Rapid Contactless Method for Measuring Fixed Oxide Charge Associated with Silicon Processing," IBM Technical Disclosure Bulletin, vol. 24, No. 6, 1981, pp. 3048-3053.

"Contactless Photovoltage vs. Bias Method for Determining Flat-Band Voltage," IBM Technical Disclosure Bulletin, vol. 32, vol. 9A, 1990, pp. 14-17.

"Contactless Electrical Equivalent Oxide Thickness Measurement," IBM Technical Disclosure Bulletin, vol. 29, No. 10, 1987, pp. 4622-4623.

* cited by examiner

METHODS AND SYSTEMS FOR DETERMINING A PROPERTY OF AN INSULATING FILM

PRIORITY CLAIM

This application claims priority to U.S. Provisional Application No. 60/394,835 entitled "Methods and Systems for Determining a Property of an Insulating Film," filed Jul. 10, 2002.

BACKGROUND OF THE INVENTION

1. Field of the Invention

This invention generally relates to determining one or more properties of an insulating film. Certain embodiments relate to determining one or more properties of an insulating film that is imperfectly insulating.

2. Description of the Related Art

Fabricating semiconductor devices such as logic and memory devices may typically include processing a substrate such as a semiconductor wafer using a number of semiconductor fabrication processes to form various features and multiple levels of the semiconductor devices. For example, insulating (or dielectric) films may be formed on multiple levels of a substrate using deposition processes such as chemical vapor deposition ("CVD"), physical vapor deposition ("PVD"), and atomic layer deposition ("ALD"). In addition, insulating films may be formed on multiple levels of a substrate using a thermal growth process. For example, a layer of silicon dioxide may be thermally grown on a substrate by heating the substrate to a temperature of greater than about 700° C. in an oxidizing ambient such as $O_2$ or $H_2O$. Such insulating films may electrically isolate conductive structures of a semiconductor device formed on the substrate.

Measuring and controlling such insulating films may be an important aspect of semiconductor device manufacturing. A number of techniques are presently available for making such measurements. For example, the physical thickness of such films may be measured with a profilometer or an atomic force microscope ("AFM"). Such techniques typically involve scanning a probe across a surface of the film on which a step is present. A measurement of the step height may be used to determine a thickness of the film. Such measurements may be disadvantageous because they require the presence of step in the film and are contacting in nature.

Electron microscopy techniques may also be used to determine a thickness of films such an insulating films. These techniques include, for example, transmission electron microscopy ("TEM") and scanning electron microscopy ("SEM"). These techniques are generally destructive and are relatively expensive due to the ultra high vacuum equipment required for such techniques.

Optical techniques may frequently be used to determine optical parameters of insulating films. In such methods, incident light and reflected light may be measured as a function of incident angle, wavelength, polarization, and/or intensity. Using models related to the propagation of light through transparent materials, the optical thickness of such films may be determined. In addition, other optical parameters such as optical index of refraction, optical extinction coefficient, and reflectivity may be obtained. Such measurements may have the disadvantage of providing only optical information, which may not be perfectly related to electrical parameters of electrical devices built using these films. Furthermore, such optical methods may only be used to measure substantially transparent materials.

Electrical measurement techniques that rely on physical contact to a conductive electrode on top of an insulating film may be used to determine relevant electrical properties of insulating films using capacitance vs. voltage ("C-V") and current vs. voltage ("I-V") measurements. Such measurements have a long history and established utility. These measurements, however, may require a conductive electrode and a contacting probe. The necessity of direct physical electrical contact is particularly undesirable in many manufacturing situations.

Non-contacting electrical test techniques have been developed to provide electrical capacitance, electrical thickness, and electrical conductivity information about insulating films. Non-contacting electrical measurements of dielectric properties have a unique advantage of providing electrically derived information without the requirement of physical contact to an electrode on top of an insulating film. These techniques typically use an ion generation source such as a corona and a non-contacting voltage measurement sensor such as a Kelvin Probe or a Monroe Probe to determine electrical properties of the films. Examples of such techniques are illustrated in U.S. Pat. No. 5,485,091 to Verkuil, U.S. Pat. No. 6,097,196 to Verkuil et al., and U.S. Pat. No. 6,202,029 to Verkuil et al., which are incorporated by reference as if fully set forth herein.

SUMMARY OF THE INVENTION

Certain embodiments of the invention relate to methods for accurately measuring electrical properties of insulating films in the presence of significant amounts of conduction or "leakage" through the insulating films. In ultra-thin insulating films, current transport through the films may become quite significant. Without carefully taking this current transport into account, most electrical techniques for measuring film capacitance or thickness in the presence of such leakage will result in a measurement incorrectly suggesting a smaller thickness or a larger electrical capacitance than would be measured in the absence of such leakage. By carefully measuring or modeling the rate of leakage and modeling the effect of such leakage on other test data, it may be possible to accurately provide electrical thickness or electrical capacitance information independent of the presence of leakage. Therefore, the effects of conduction through such insulating films may be characterized and used to determine various properties of the films more accurately than methods not taking into account conduction through imperfect insulating films. Accounting for such conduction may allow for separation of effects related to current transport from those unrelated to current transport, which may improve process control capability. Other uses of conduction information are outlined as well as details pertinent to optimum measurements.

An embodiment relates to a method for determining one or more properties of an insulating film formed on a substrate. The insulating film may be, for example, silicon dioxide ("$SiO_2$"), a high-k dielectric material (i.e., a material having a dielectric constant of greater than about 3.9), or a low-k dielectric material (i.e., a material having a dielectric constant of less than about 3.9). The substrate may include, but is not limited to, silicon or epitaxial silicon, another semiconductor or conductive material, silicon-on-insulator ("SOI"), and/or a series of layers, of which each may be an insulator or a conductor. In addition, the insulating film may have a conductive material formed thereon.

The method may include obtaining a charge density measurement of the insulating film. Obtaining a charge density measurement may include, for example, receiving input responsive to a charge density measurement from a measurement device. Alternatively, obtaining a charge density measurement may include depositing a charge onto a surface of an insulating film, measuring the charge density of the deposited charge, and recording the times at which the charge was deposited and at which the measurement was made. The charge may be deposited using a point corona source, a wire or "blanket" corona source, or an e-beam or ion beam source. In addition, depositing a charge may be performed repeatedly. For each deposition of charge, the charge density may be measured, and the times at which the charge was deposited and measured may be recorded. In another embodiment, the charge density may not be measured, but may be known from a previously established calibration. Similarly, the timing information may not be recorded, but may be known from a previously established methodology.

The method may also include obtaining a voltage measurement of a surface voltage potential of the insulating film relative to a bulk voltage potential of the substrate corresponding to the charge density measurement. Obtaining such a voltage measurement may include, for example, receiving input responsive to such a voltage measurement from a measurement device. Alternatively, obtaining a voltage measurement may include depositing a charge onto a surface of the insulating layer, measuring the voltage, and recording the times at which the deposition and the measurement were performed. Obtaining the voltage measurement may be performed repeatedly for each charge deposition as described above.

Measuring the voltage may be performed with a Kelvin probe or a Monroe probe or by an electrostatic force method. Measuring the voltage may also be performed in the presence of a background light. In addition, obtaining a voltage measurement may include measuring the voltage in accumulation (i.e., negative voltages on a p-type wafer or positive voltages on an n-type wafer), depletion, inversion (i.e., positive voltages on a p-type wafer or negative voltages on an n-type wafer), or a combination of two or three of them.

In addition, the method may also include obtaining a rate of voltage decay of the voltage measurement. Obtaining a rate of voltage decay may include receiving input responsive to a rate of voltage decay from a measurement device. Alternatively, obtaining a rate of voltage decay may include measuring the rate of voltage decay subsequent to or prior to obtaining a voltage measurement. Obtaining a rate of voltage decay, however, may also include determining the rate of voltage decay using a theoretical model. A theoretical model may include functions that account for a finite time required for a corona deposition and a finite time required for a voltage measurement. Such times may be measured and recorded or may be determined from a previously established methodology. The rate of voltage decay may also be modeled using, for example, the Fowler-Nordheim tunneling model, a direct tunneling model, or an empirical model.

At any particular step, which may be denoted with a subscript "i," only a partial subset of possible data (i.e., leakage, timing, charge, voltage potential) to be acquired may actually be obtained or measured. In addition, the data may be acquired in a map format, by means of substantially uniform blanket depositions of charge and subsequent mapping of surface voltage potential, $V_i$, and surface voltage potential as a function of time, $V_i(t)$. The method may further include determining the one or more properties of the insulating film using the charge density measurement, the voltage measurement, and the rate of voltage decay. Determining the one or more properties may include altering the voltage measurement using the rate of voltage decay and using the altered voltage measurement and the charge density measurement to calculate the one or more properties.

The one or more properties may include capacitance and resistance. In addition, the method may include determining a thickness of the insulating film from the capacitance and/or the resistance. For example, the method may include determining a film thickness using a known relationship between capacitance and thickness. In addition, the method may include determining a thickness of the insulating film using the rate of voltage decay and a theoretical model relating leakage to insulating film thickness. The method may also include determining a frequency dependency of a device, which includes the insulating film and the substrate, in the presence of current leakage through the insulating film using the capacitance and the resistance.

The method may also determining a dielectric constant of the insulating film using the capacitance and the thickness. For example, the method may include determining a dielectric constant of the insulating film from an expression relating capacitance, thickness, and dielectric constant. Appropriate expressions may include, but are not limited to, a parallel plate capacitor, a parallel plate capacitor with fringing fields accounted for, and an expression taking into account the detailed geometry of the insulating film. In addition, the method may include obtaining a thickness of the insulating film using an additional experimental method and determining a dielectric constant of the insulating film using the capacitance and the thickness. Alternatively, the method may include determining a capacitance of an insulating film using an theoretically determined rate of voltage decay. For example, the rate of voltage decay may be determined theoretically and may be used to correct voltage measurements. The capacitance may be determined from charge density data and corrected voltage measurements. In addition, the method may include determining a dielectric constant of the film using the capacitance and a thickness of the film.

In an embodiment, the method may include altering a parameter of an instrument coupled to a process tool in response to at least one of the properties of an insulating film such as capacitance, dielectric constant, and/or thickness of the insulating film using a feedback control technique and/or a feedforward control technique.

An additional embodiment relates to a method for determining a thickness of an insulating film formed on a substrate. The method may include depositing a charge on the insulating film. The charge may be deposited using a non-contact technique. The method may also include measuring a surface voltage potential of the insulating film relative to a bulk voltage potential of the substrate corresponding to the charge. The surface voltage potential may be measured using a non-contact technique. Measuring the surface voltage potential may also be performed in accumulation, depletion, inversion, or a combination of two or three of them.

The method may also include measuring a rate of voltage decay of the insulating film. Measuring the rate of voltage decay may be performed prior to or subsequent to measuring the surface voltage potential. Depositing the charge, measuring the surface voltage potential, and measuring the rate of voltage decay may be performed at different times. In addition, if the charge is deposited substantially uniformly on an area of the insulating film, the surface voltage potential and the rate of voltage decay may be measured over this area. In this manner, the method may also include generating a map of the surface voltage potential and the rate of voltage decay over the area. The method may further include determining a thickness of the insulating film using the rate of voltage decay and a theoretical model relating leakage to insulating film thickness. The theoretical model may include, for example, a Fowler-Nordheim tunneling model or a direct tunneling model.

In an embodiment, the method may include directing light toward the insulating film during measurement of the surface voltage potential and during measurement of the rate of voltage decay. In a further embodiment, the method may include altering a parameter of an instrument coupled to a process tool in response to a thickness of the insulating film using a feedback control technique and/or a feedforward control technique.

A further embodiment relates to a method for determining a property of an insulating film formed on a substrate. The method may include depositing a charge on the insulating film to generate an electric field across the insulating film. The electric field may be selected to reduce leakage of the insulating film. For example, the electric field may be selected to be less than about 0.2 MV/cm or about 0 MV/cm. In addition, the electric field may be selected using an empirical method or an experimental method. For example, the electric field may be selected empirically using charge vs. voltage ("Q-V") or dV/dt data. The method may also include measuring a characteristic of the insulating film at the electric field. For example, measuring a characteristic may include obtaining Q-V or capacitance vs. voltage ("C-V") data for the insulating film at reduced leakage corresponding to the electric field or low voltages. The Q-V data may be acquired from a corona based apparatus. Alternatively, the Q-V or C-V data may be acquired from a C-V plotter. In addition, the method may include determining the property of the insulating film using the characteristic.

BRIEF DESCRIPTION OF THE DRAWINGS

Other objects and advantages of the invention will become apparent upon reading the following detailed description and upon reference to the accompanying drawings in which.

Figure 1:
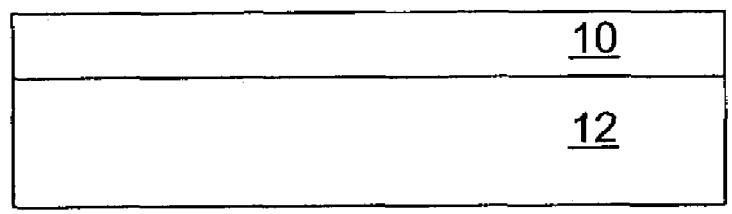
FIG. 1 depicts a partial cross-sectional view of an embodiment of an insulating film formed on a substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The following description generally relates to systems and methods for measuring electrical and physical properties of insulating films. In a common implementation, the films in question may be produced in processes of semiconductor device manufacturing. In particular, the following description relates to systems and methods for measuring such insulating films in a non-contact manner, and in the presence of imperfect insulation.

Present technology for manufacturing integrated circuits and semiconductor devices makes extensive use of the formation of insulating films. These films may also be referred to as "dielectric layers." In a typical implementation, such an insulating film may include silicon dioxide ("$SiO_2$"), silicon nitride ("$Si_3N_4$"), or a nitrided form of amorphous $SiO_2$, which may be commonly referred to as oxynitride ("$SiO_xN_y$"). Many other materials are also commonly used. Such films frequently may have relatively high insulating qualities. However, relatively thin films (i.e., films having a thickness of less than about 8 nm) may depart substantially from ideal insulating behavior. That is to say that such films may allow significant amounts of current to flow through the insulating film.

For insulating films that are not a form of $SiO_2$, significant departures from a perfect insulator may occur at substantially greater thickness such as thicknesses of greater than about 30 nm, or even greater than about 50 nm. Such less ideally insulating materials may include materials commonly known as "high-k" or "low-k" insulators, where "k" refers to the real part of the dielectric constant as measured at electrical frequencies. A high-k dielectric material may include any material having a dielectric constant of greater than about 3.9. Example of high-k materials include, but are not limited to, tantalum pentoxide ("$Ta_2O_5$"), hafnium dioxide ("$HfO_2$"), aluminum trioxide ("$Al_2O_3$"), and zirconium dioxide ("$ZrO_2$"). A low-k dielectric material may include any material having a dielectric constant of less than about 3.9. Examples of low-k materials include, but are not limited to, proprietary materials known as Silc™, Black Diamond™, and Flare™. It is to be understood that the methodology described herein is not specific to any composition or thickness of insulating film being used.

Such insulating films may be formed, for example, by deposition or thermal growth on a conductive or semiconductor substrate. The substrate may include, but is not limited to, silicon, epitaxial silicon, silicon-on-insulator ("SOI"), or another semiconductor or conductive material such as gallium arsenide or indium phosphide. The substrate may also include any substrate commonly found and/or processed in semiconductor fabrication facilities, which may be commonly referred to as a "wafer." In other cases, the insulating film of interest may be the top layer of a stack of insulators, insulators and conductors, or conductors.

Figure 2:
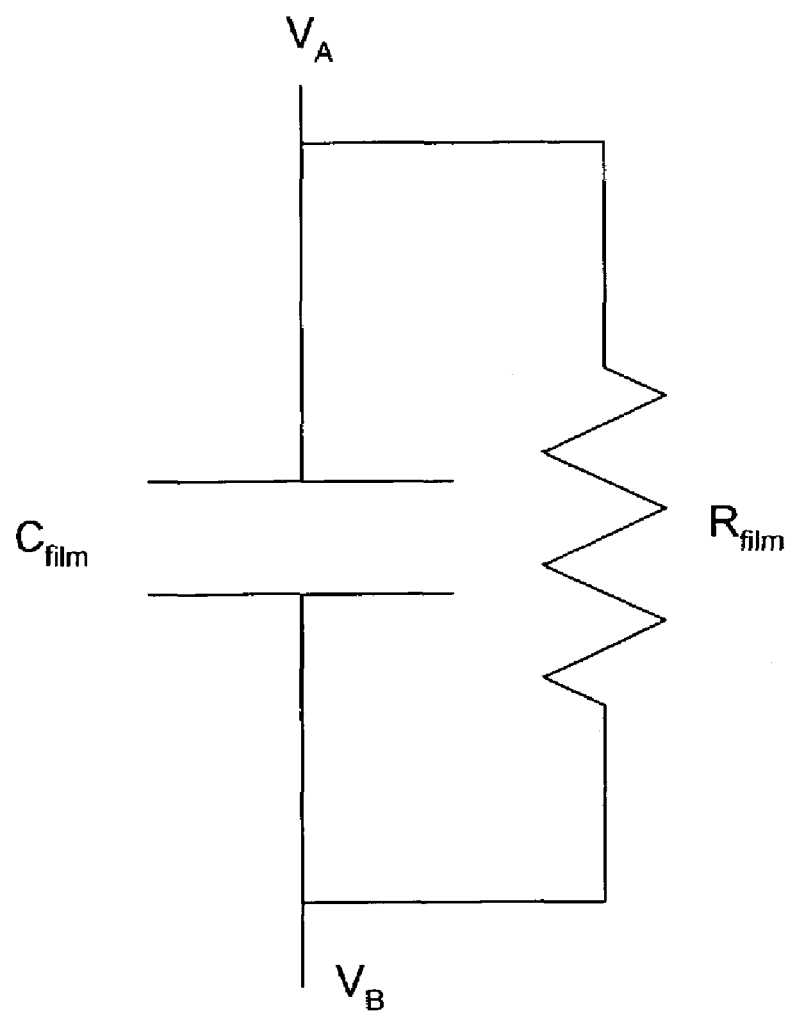
FIG. 2 depicts a schematic diagram of the insulating film formed on the substrate.

For the purposes of simplicity of illustration, FIG. 1 illustrates a single layer of insulating film 10 formed on substrate 12. The insulating film may be schematically illustrated as shown in FIG. 2, in which a resistance of the film, $R_{film}$, is electrically in parallel with a capacitance of the film, $C_{film}$. $R_{film}$ corresponds to the resistance of this film to current transport vertically through the film within a given test area, A. $R_{film}$ may vary with voltage as $R_{film}$=function ($V_{film}$). $C_{film}$ corresponds to the capacitance of the region of the insulating film under test. $R_{test}$ may be related to the film resistivity, $\rho_{film}$, by the following equation:

$$R_{film} = \rho_{film} * T_{film}/A, \quad (1)$$

where $T_{film}$ is the physical thickness of the film, and A is the cross-sectional area of the region of the insulating film being tested. As shown in FIG. 2, $V_A$ corresponds to the voltage potential at the top of the film, and $V_B$ corresponds to the voltage of the substrate underneath the film. $V_B$ will be considered to be at ground potential for the purpose of the immediate discussion.

In the absence of leakage, the voltage between points A and B, $V_{AB}$, may be defined by the equation for a parallel plate capacitor:

$$Q = V_{AB} * C_{film} \quad (2)$$

where Q represents charge on the surface of the insulating film. By making depositions of charge, the total of which is recorded as $Q_i$ using a non-contacting technique and measuring subsequent voltage measurements of the potential, $V_{AB}$, recorded as $V_i$ using a non-contacting technique, the capacitance of the film, $C_{film}$, may be determined.

In many implementations, the initial charge of the surface is unknown, and equation 3 may be rewritten as:

$$Q_i = V_i * C_{film} + X_1 \quad (3)$$

where $X_1$ is an offset related to the initial charge on the surface of an insulating film and within the insulating film, but which is unimportant to this discussion. $C_{film}$ may be determined using a least-squares fit of any portion of $Q_i$–$V_i$ data with a slope being equal to $C_{film}$ according to equation 3. If the dielectric constant of the film is known or is assumed, an "electrical film thickness," $T_{film}$, may be determined from the capacitance. The capacitance of the film may be related to the electrical thickness using the equation:

$$T_{film} = \epsilon_0 * k * A / C_{film}, \quad (4)$$

wherein $\epsilon_0$ is the free space permittivity of vacuum, and k is the film relative dielectric constant described above. In a technologically feasible implementation, the voltages, $V_i$, corresponding to charge states, $Q_i$, may be measured at different times denoted as $t = t_i$.

Figure 3:
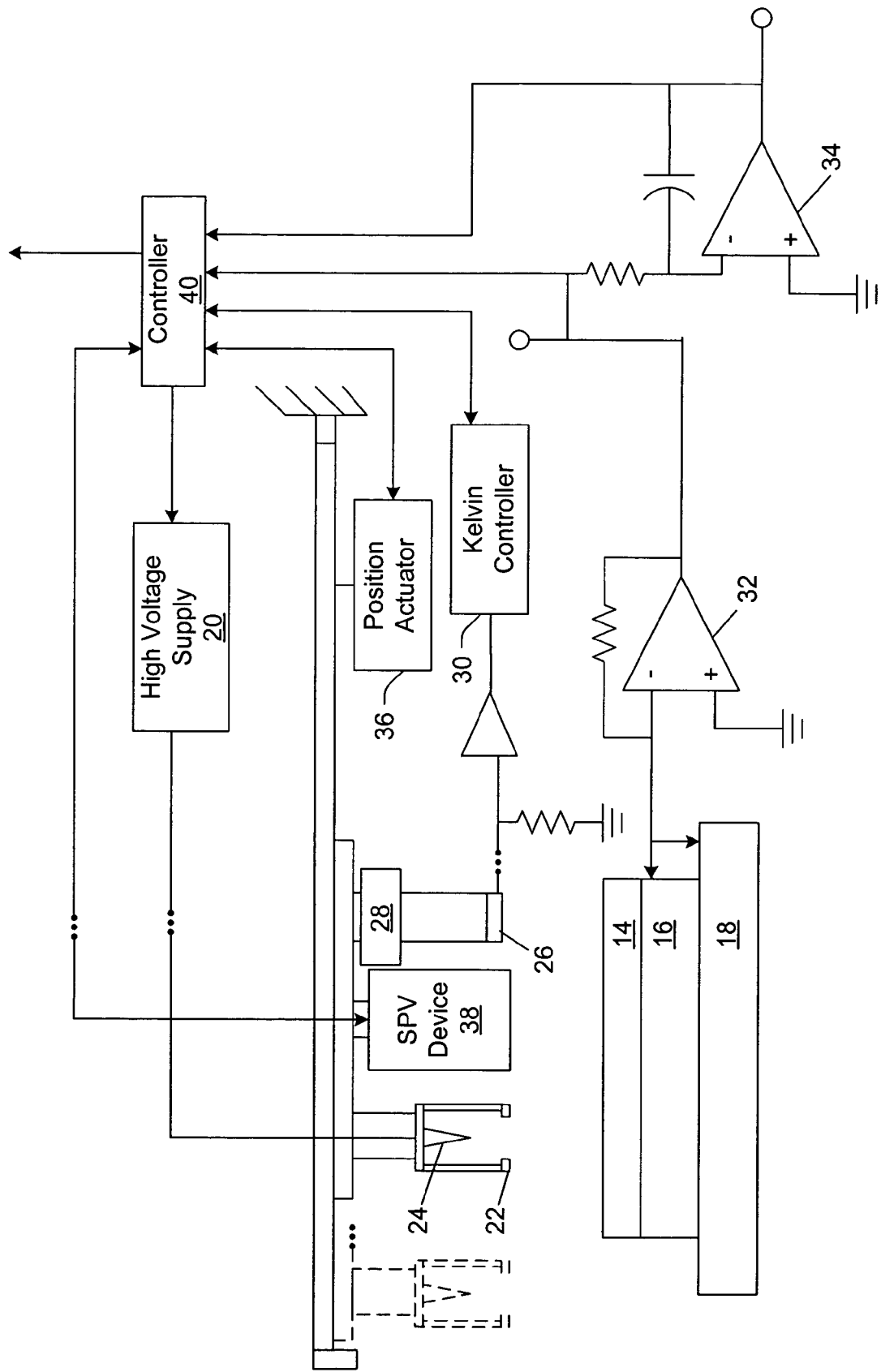
FIG. 3 depicts a schematic diagram of an embodiment of a system configured to measure charge density and voltage using non-contacting techniques.

An example of a system configured to measure charge density and voltage using non-contacting techniques is illustrated in FIG. 3. The system may be configured to measure current-voltage characteristics of insulating film 14 formed on substrate 16. The system may include wafer chuck 18 configured to hold substrate 16 during a measurement process. Wafer chuck 18 may also provide a grounding contact to substrate 16. The grounding contact may be obtained, for example, from a high pressure contact using a sharp tungsten carbide needle. The system may also include high voltage supply 20 coupled to corona gun 22. High voltage supply 20 may be configured to supply high voltage (i.e., about 6 kV to about 12 kV) to the corona gun to produce positive or negative corona charges depending on the polarity of supply 20. Corona gun 22 may include one or more needles 24 coupled to high voltage supply 20.

In addition, the system may include Kelvin probe 26. Kelvin probe 26 may include an electrode coupled to vibrator 28. Movement of probe 26 above a charged surface may result in an AC voltage representative of the potential of the charged surface. Kelvin controller 30 may be configured to convert an AC voltage to a signal corresponding to the voltage of the surface.

Current flowing through insulating film 14 and substrate 16 from corona gun 22 may be converted to a voltage by the current-to-voltage converter 32. This voltage (current) may be integrated by charge integrator 34 to provide a measure of the charge deposited by corona gun 22 on insulating film 14. The circuits, thus, are configured as a coulombmeter. The system may also include position actuator 36. Position actuator 36 may be configured to move corona gun 22 and Kelvin probe 26 over substrate 16, as shown in phantom in FIG. 3. The system may also include surface photo voltage device 38. SPV device 38 may be configured to make an SPV measurement using a relatively high intensity light source such as a xenon flash tube.

The system may further include controller 40 configured to control operation of the system. Controller 40 may be configured to control position actuator 36 and high voltage supply 20 in response to Kelvin controller 30, the current-to-voltage converter 32, and the current-to-integrator 34. The controller may also be configured to provide a measurement of the current-voltage behavior of insulating film 14 and substrate 16. The controller may be, for example, a dedicated microprocessor-based controller or a general purpose computer.

Figure 4:
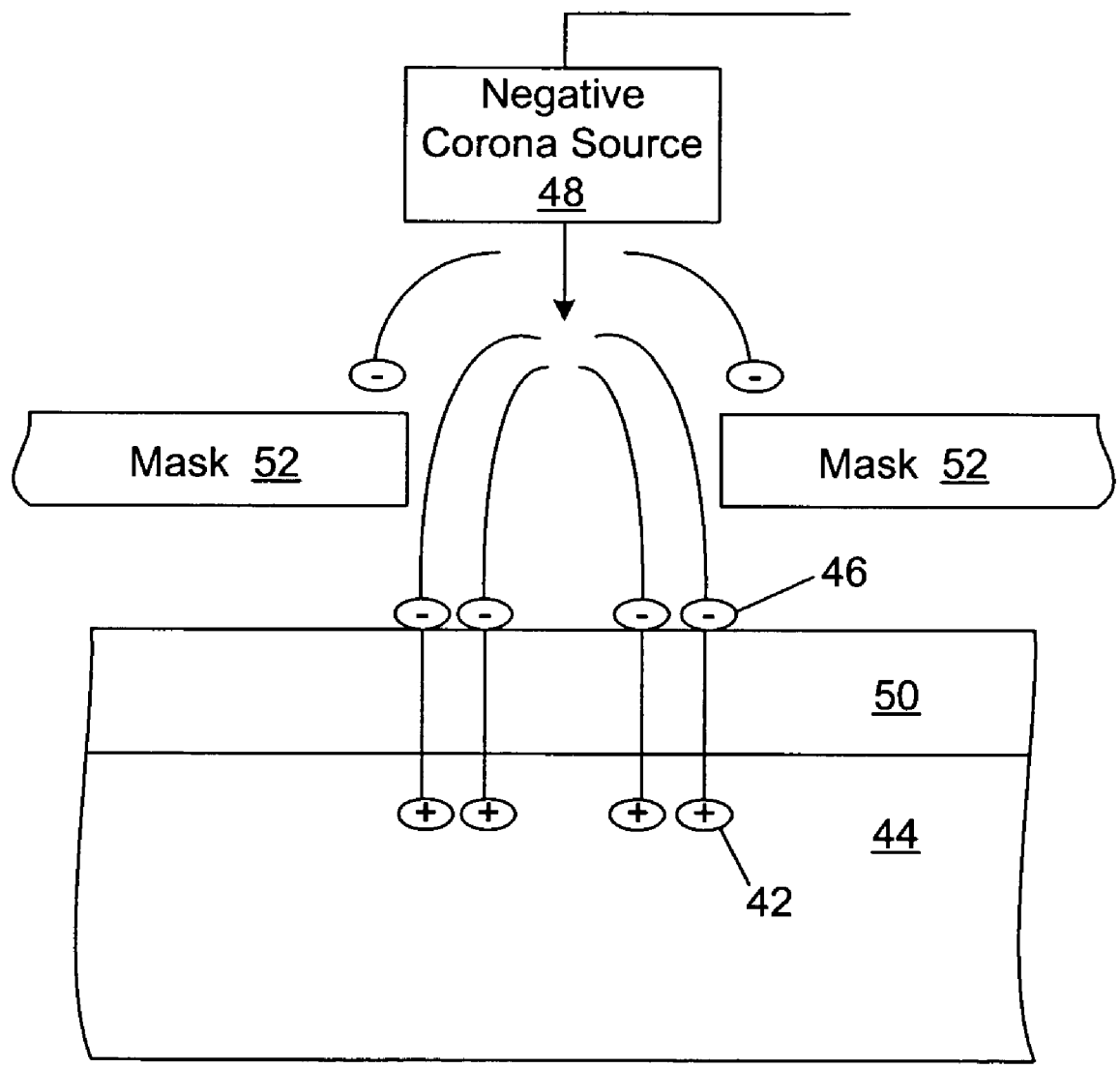
FIG. 4 illustrates an embodiment of a charge deposition on a surface of an insulating film using a corona source.

FIG. 4 illustrates an embodiment of a charge deposition on a surface of an insulating film using a corona source. As shown in FIG. 4, positive charge accumulation 42 in p-type silicon substrate 44 may result from the deposition of negative charges 46 from negative corona source 48 onto surface of oxide layer 50 overlying substrate 44. The corona discharge may be applied to the area of interest via mask 52. In one embodiment, it may be necessary for purposes of obtaining accurate thickness measurements, that a uniform density of charge 46 be deposited through the aperture in mask 52.

Figure 5:
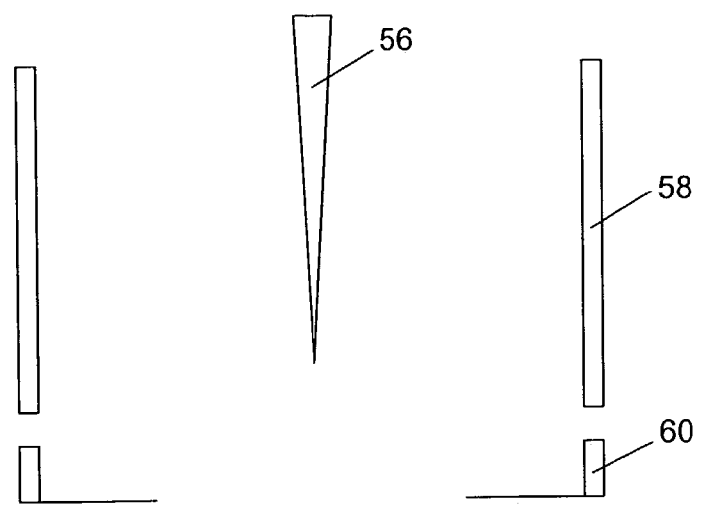
FIGS. 5 and 6 depict partial cross-sectional views of alternative embodiments of a corona source.
Figure 5:
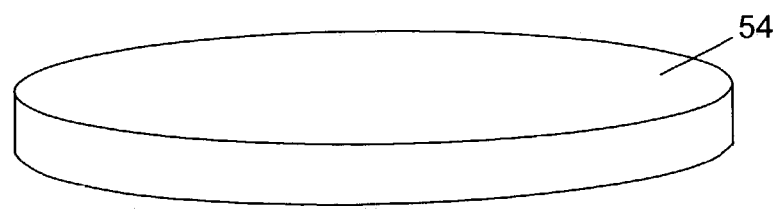
Figure 6:
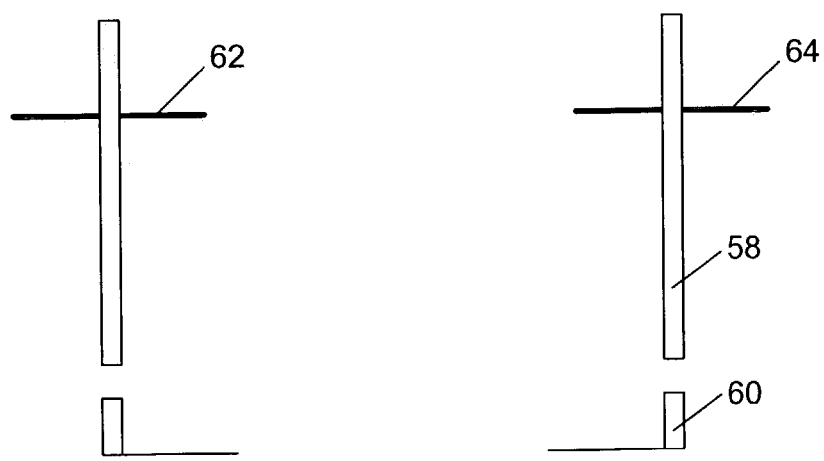
Figure 6:

FIGS. 5 and 6 illustrate partial cross-sectional views of alternative embodiments of a corona source, which may be used to deposit a charge substantially uniformly over an area of specimen 54. Specimen 54 may include an insulating film and a substrate as described herein. The corona sources may be configured to provide a well-defined and substantial beam charge density (to minimize measurement time) having relative uniformity (for measurement accuracy) across the selected site of interest on specimen 54. As shown in FIG. 5, the corona source may include needle 56 and beam shaping electrodes 58 and 60. Beam shaping electrodes 58 and 60 may be arranged concentric with an axis of needle 56. Beam shaping electrodes 58 and 60 and the biasing voltages applied thereto may improve the corona charging capability of the gun in two important ways. First, lower electrode 60 may act as a mask for defining the diameter of the area of corona deposition. Second, the bias voltage on electrode 60 (same polarity as the corona ions) repels ions that normally would be captured by the edge of electrode 60 and directs them down to the specimen site with an enhanced density that abruptly ceases under the edge of electrode 60.

Upper electrode 58 may help to boost the efficiency of the corona source by being biased at a relatively high voltage (up to ±3 kV) with the same polarity as the corona ions. Potentials in the range of ±6–9 kV and up to ±1.5 kV are appropriate for needle 56 and mask electrode 60, respectively. This may result in an electric field configuration, in the upper region of the corona source, that prevents many of the ions from being captured by the upper electrode and directs them down to lower electrode 60 which, in turn, directs them to the specimen site. It should be noted that needle 56 and electrodes 58 and 60 may be supported and insulated from each other by suitable insulated support members (not shown) that may allow for the application of the necessary biases.

FIG. 6 is essentially the same as FIG. 5 except for the important difference that two facing and horizontal needles 62 and 64 are provided in FIG. 6 in lieu of the single vertical needle 56 of FIG. 5. The potential applied to needles 62 and 64 and electrodes 58 and 60 of FIG. 6 may be the same as the corresponding parts in the case of FIG. 5.

Additional examples of non-contact corona sources are illustrated in U.S. Pat. No. 4,599,558 to Castellano et al., U.S. Pat. No. 5,594,247 to Verkuil et al., and U.S. Pat. No. 5,644,223 to Verkuil and are incorporated by reference as if fully set forth herein. In an embodiment, a system as described herein, may include a non-contact work function sensor such as a Monroe probe in place of a Kelvin probe. Further examples of work function sensors that may be incorporated into the system are illustrated in U.S. Pat. No. 4,812,756 to Curtis et al., U.S. Pat. No. 5,650,731 to Fung, and U.S. Pat. No. 5,767,693 to Verkuil, which are incorporated by reference as if fully set forth herein. In addition, any other appropriate system and corona source known in the art may be used for carrying out a method as described herein.

Figure 7:
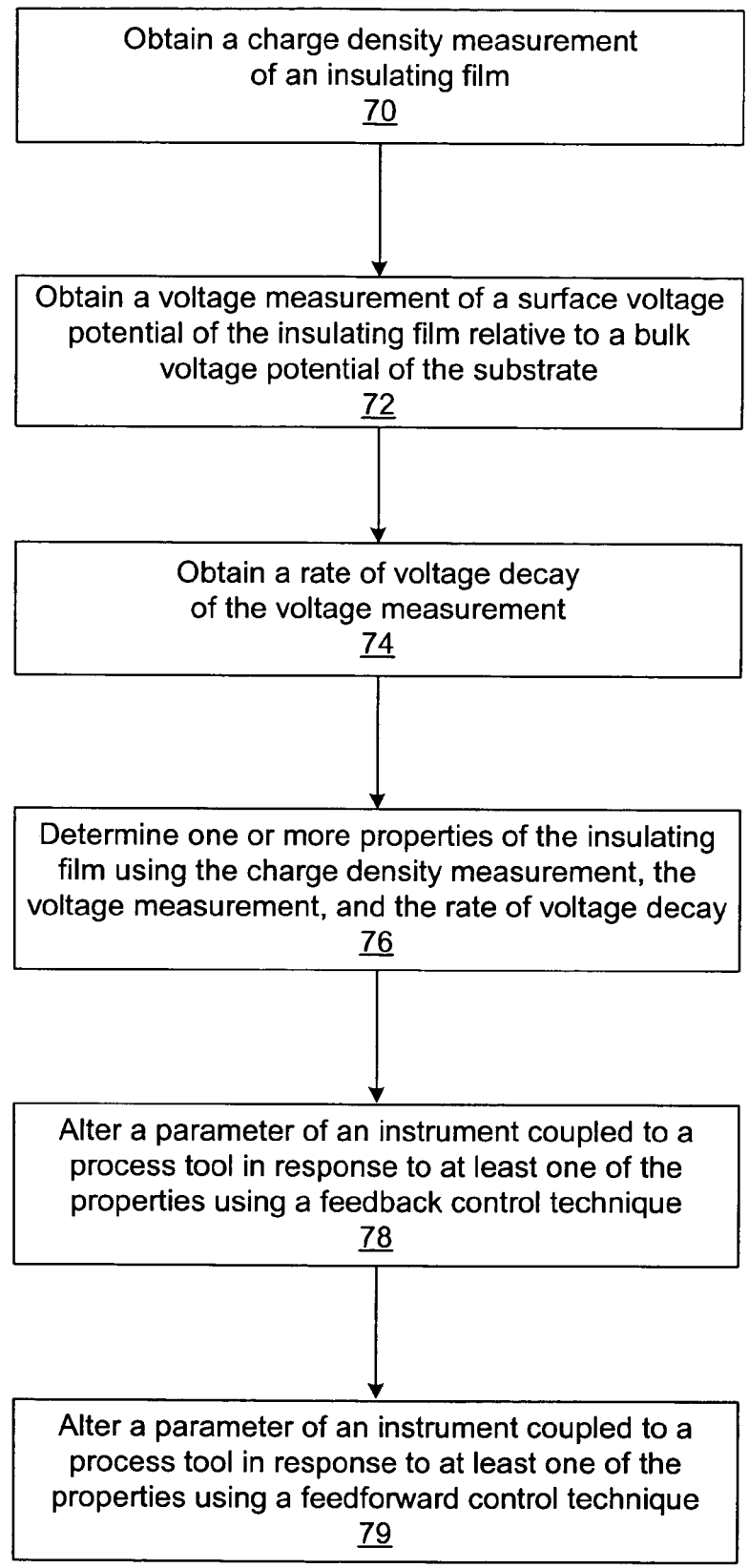
FIG. 7 depicts a flow chart illustrating an embodiment of a method for determining one or more properties of an insulating film formed on a substrate.

FIG. 7 illustrates an embodiment of a method for determining one or more properties of an insulating film formed on a substrate. The method may include measuring a voltage of an upper surface of the insulating film surface, $V_i$, and recording the time, $t_i$, at which the voltage was measured. The method may also include obtaining a charge density measurement of the insulating film, as shown in step 70. For example, obtaining a charge density measurement of the insulating film may include applying a deposition of charge to the insulating film in a non-contacting manner with a deposition source as described herein. The deposition source may include a point corona source, a wire or "blanket" corona source, or an e-beam or ion beam source. Obtaining the charge density measurement may also include measuring the charge deposited and recording the total charge deposited up to this time as $Q_i$, with i being an index of the total number of depositions. The times at which the charge was deposited and measured may also be recorded. Alternatively, the timing information may not be recorded but may be known from a previously established methodology. Furthermore, the charge density may not need to be measured if the charge density is known from a previously established calibration of the deposition source.

The method may also include obtaining a voltage measurement, $V_i$, of a surface voltage potential of the insulating film relative to a bulk voltage potential of the substrate corresponding to the charge density measurement, as shown in step 72. Obtaining a voltage measurement may include measuring the voltage and recording the time at which the voltage was measured. Measuring the voltage may be performed with a Kelvin probe, a Monroe probe, or an electrostatic force method. Measuring the voltage may also be performed in the presence of a background light. In this manner, the measured voltage may include a surface photo voltage ("SPV") measurement.

The rate of current flow through an insulating film may be measured at a given bias voltage. One method of determining the rate of current flow through an insulator is to measure the rate of voltage decay due to current transport through the insulator. For example, a voltage measured at $t_i$ may be lowered in magnitude by the presence of a non-perfect insulating film due to a finite amount of time elapsing between times $t_i$ and $t_{i-1}$ and due to current flow through the resistance illustrated as $R_{film}$ in FIG. 2.

The method may include obtaining a rate of voltage decay by monitoring the voltage measurement as a function of time, $V_i(t)$, as shown in step 74. An example of such a method is illustrated in U.S. Pat. No. 6,202,029 B1 to Verkuil et al., which is incorporated by reference as if fully set forth herein. Briefly, a decay in voltage due to current through an insulator may be experimentally determined by biasing the sample to a desired voltage and measuring the rate of voltage decay with time after the biasing step. Alternatively, obtaining a rate of voltage decay may include measuring the rate of voltage decay prior to obtaining a voltage measurement, $V_i$.

In addition, steps 70, 72, and 74 may be repeated in sequence, incrementing the recording index number "i" each time, to generate a set of data, which may include $Q_i$, $V_i$, $V_i(t)$, and $t_i$, describing the charge to voltage and leakage relationship. For example, depositing a charge may be performed repeatedly. For each deposition of charge, the charge density may be measured. In addition, the time at which the charge was deposited may be recorded. A preferred step size for the charge deposition may be in a range from about $1 \times 10^{-8}$ C/cm$^2$ to about $1 \times 10^{-6}$ C/cm$^2$. In an einbodiment, the number of data points, i, that may be acquired may be about 2 to about 100. At any particular step, which may be denoted with a subscript "i," only a partial subset of possible data (i.e., leakage, timing, charge, voltage potential) to be acquired may actually be obtained or measured. In addition, the data may be acquired in a map format by means of substantially uniform blanket depositions of charge over an area of the specimen and subsequent mapping of $V_i$ and $V_i(t)$ over the area.

$V_i(t)$ data may be differentiated to obtain the rate of voltage decay, $dV_i/dt$, at a corresponding voltage indicated by the subscript, i. $V_i(t)$ data may be further analyzed to obtain a current density by using the equation:

$$I_i = C_{film} * dV/dt, \tag{5}$$

and the film resistance may be defined by the equation:

$$V_{film} = I * R_{film}. \tag{6}$$

It is to be understood that there are obvious variations to the specific details in which the resistance of the insulating film may be experimentally quantified. It is also to be understood that it is trivial to rewrite equations 5 and 6 in terms of current density $J_{film}$, resistivity $\rho_{film}$, resistance $R_{film}$, conductivity $\sigma_{film}$, or other equivalent variables.

The method may also include determining one or more properties of the insulating film using the charge density measurement, the voltage measurement, and the rate of voltage decay, as shown in step 76. For example, if experimental data for $V_i(t)$ is obtained in addition to $Q_i-V_i$ data, it is possible to correct the $Q_i-V_i$ data for the presence of leakage. For a sequence of charge-voltage measurements, $Q_i$, $V_i$, with voltages being recorded at time $t_i$, the voltage that may be recorded in the absence of leakage may be determined as:

$$V'_i = V_i - \sum_{i=0}^{i} \left[ \frac{dV_i}{dt} - (ti - ti - 1) \right]. \tag{7}$$

$V'_i$ may be used to determine capacitance of an insulating film. In addition, thickness of the insulating film may be determined using equation 4 with leakage now being taken into account. Conceptually, the correction illustrated in equation 7 may be thought of as "adding back in" all of the voltage lost to leakage through the insulating film up to and including the present time.

It should be readily obvious that the finite time required for charge deposition, $t_{i\_corona}$, and the finite time required for voltage measurements, $t_{i\_voltage}$, may be handled with obvious extensions to equation 7. A more advanced methodology for correcting leakage may be to integrate the rate of leakage over the time involved, as described in the following equation:

$$V'_i = V_i - \int_{-1}^{i} \frac{dV}{dt} dt, \tag{8}$$

where dV/dt corresponds to the instantaneous rate of voltage decay at any point in time.

A more sophisticated analysis of $Q_i$-$V_i$ data applicable to the measurement of insulating films on a semiconductor substrate such as that described in U.S. Pat. No. 5,485,091 to Verkuil, which is incorporated by reference as if fully set forth herein, may also be corrected for leakage using equation 7. In such a model, the voltage at point $V_B$ may not be at ground potential and may change as a function of biasing. $V_B$ may be thought of as the potential of the silicon with respect to the silicon bulk potential. For semiconductors, $V_B$ has a functional relationship governed by:

$$V_B = f(Q, N_d, V_{fb}, C_1 \ldots C_N), \tag{9}$$

The details of this functional relationship are known and may be found in references such as Sze, "Physics of Semiconductor Devices," pp. 369, $2^{nd}$ Ed., Wiley-Interscience, 1981. In such a functional relationship, additional information related to the state of the system such as $V_{fd}$ or $A_d$ may be measured by another method and used as known inputs to the function. Other methodologies for analyzing Q-V or C-V data may be modified to take into account a correction for leakage such as described by Equation 7. As described herein, a method for correcting voltage measurements of insulating films, which may used to determine insulating film properties, for the presence of leakage may include any method for analyzing Q-V data known in the art.

As an alternative to measuring $dV_i/dt$ for an insulating film, if the film has been previously characterized, it may be possible to use an assumed rate of leakage for $dV_i/dt$ to correct for leakage effects.

Obtaining a rate of voltage decay may also include determining the rate of voltage decay using a theoretical model. Various theoretical models describing mechanisms for current transport through relatively thin insulating films have been developed and published. Examples of such models include, but are not limited to, Fowler-Nordheim tunneling, direct tunneling, Poole-Frenkel conduction, hopping conduction, space charge limited conduction, and Shottky or Thermionic conduction. Such theoretical models may have a general form of I=f(V, physical_$T_{film}$, other_material_parameters). For example, the Fowler-Nordheim tunneling model has the following form:

$$I = A_1 (V/T_{film})^2 \exp(A_2 * T_{film}/V). \tag{10}$$

Other models of leakage have different functional dependencies. In general, all such models may be expressed in a functional form such as:

$$I = \text{function}(T_{film}, V, A_1, A_2 \ldots A_N), \tag{11}$$

where $A_1, A_2 \ldots A_N$ represent constants that may or may not be of interest. Note that equation 5 may be used with equation 10 or 11 to produce a theoretical expression for $dV_i/dt$:

$$dV_i/dt = \text{function}(T_{film}, V_i, A_1, A_2 \ldots A_N). \tag{12}$$

A theoretical model may include functions that account for a finite time required for a corona deposition and a finite time required for a voltage measurement. Such times may be recorded or may be determined from a previously established methodology.

If a theoretical model for conduction through the film being measured has been previously established, then equation 12 may be used to determine $T_{film}$ by using experimental data for $dV_i/dt$ at various voltages $V_i$. For example, equation 12 may be solved for $T_{film}$ by using a non-linear least squares fitting algorithm. An example of such an algorithm may be the Levenberg-Marquardt Method as illustrated by Press et al., in "Numerical Recipes in C," $2^{nd}$ Ed., p. 683, Cambridge University Press, 1993. Other known methods for non-linear least squares fitting include the "full Newton type" and the "More method." In solving equation 12 using such fitting, prior knowledge of some of the constants $A_1 \ldots A_N$ may be helpful buy may not be necessary. An appropriate functional form of the current flow used to determine a theoretical $dV_i/dt$ may be selected based on theoretical or experimental data.

If a methodology using equation 3 has been used to obtain $C_{film}$, and a methodology using equation 12 has been used to obtain $T_{film}$, then these two parameters may be used to obtain the dielectric constant, k. For example, k may be obtained using a known relationship between dielectric constant, capacitance, and film thickness. An appropriate known relationship may include, but is not limited to, the expression for parallel plate capacitance:

$$k = \epsilon_0 A / (C_{film} * T_{film}) \tag{13}$$

An appropriate known relationship between the dielectric constant, capacitance, and film thickness, however, may also include a parallel plate capacitor with fringing fields accounted for and an expression taking into account the detailed geometry of the insulating film.

Furthermore, $T_{film}$ may be determined independently using an experimental method. Methods for determining $T_{film}$ independently may include, but are not limited to, ellipsometry, reflectometry, transmission electron microscopy, and any other commercially available techniques. In this manner, a dielectric constant of an insulating film may be determined from a thickness and a capacitance that are independently determined. An independent determination of k may be a technologically important aspect for characterizing many dielectric materials.

Alternatively, the method may include determining a capacitance of an insulating film using a theoretically determined rate of voltage decay. For example, the rate of voltage decay may be determined theoretically and may be used to correct voltage measurements. A leakage model, as described by equation 12, may be used directly to determine the expected rate of leakage for a given voltage and insulating film thickness if the constants $A_1 \ldots A_N$ are known or have been experimentally determined. Such a model may be used in equation 7 in place of experimental data for $dV_i/dt$. Since $T_{film}$ is a parameter that equation 12 depends on, equation 7 may need to be simultaneously solved with equation 3 to determine $C_{film}$ or $T_{film}$ in the absence of leakage. In this manner, the capacitance may be determined from charge density data and corrected voltage measurements. In addition, the method may include determining a dielectric constant of the film using the capacitance and a thickness of the film. This methodology has the advantage of not requiring experimentally derived leakage of the film under test to correct for such leakage.

The method may also include determining a frequency dependency of a device that includes the insulating film and the substrate in the presence of current leakage through the insulating film. Such a frequency dependency may be determined using the capacitance and the resistance. For example, by using a model for parallel $R_{film}$ and $C_{film}$, as described herein, the performance of a circuit as shown in FIG. 2 may be determined at any frequency, when a measurement is performed that ignores leakage contributions. For example, the model may be used to correlate data acquired at one frequency to data or device performance at different frequencies. Such a correlation may be easily accomplished using known formulas for the complex impedance of a parallel circuit.

If the insulating film is one of a plurality of insulating films or one of a plurality of insulating films and conductive films formed on a substrate, then the methods described herein may be used to determine a lump sum effective resistance and/or capacitance corresponding to the series resistance and/or capacitance, respectively, of the plurality of layers. If the capacitance or resistance of enough individual layers is known from one or more other techniques, then the unknown properties of a particular insulating film may be determined using a method as described herein and a model for series resistance and capacitance. The presence of a conductive layer formed on top of the insulating film is also not a hindrance to the methodology described herein as long as charge deposition is constrained to an area, A. Such a charge constraint may be achieved, for example, by a pattern formed on or in such an upper conductive layer.

In an alternative embodiment, obtaining a charge density measurement, as described above, may include receiving input responsive to a charge density measurement from a measurement device. In addition, obtaining a voltage measurement may include receiving input responsive to a voltage measurement from a measurement device. Furthermore, obtaining a rate of voltage decay may include receiving input responsive to a rate of voltage decay from a measurement device. Appropriate measurement devices may be include, but are not limited to, measurement devices as illustrated in FIG. 3. In this manner, a method for determining one or more properties of an insulating film may be a computer-implemented method. Furthermore, the computer-implemented method may also include any of the steps as described herein.

In an embodiment, a processor such as a computer system may be configured to operate software to perform a computer-implemented method according to the above embodiments. The computer system may include a memory medium on which computer programs may be stored for performing the computer-implemented method. The term "memory medium" is intended to include an installation medium, e.g., a CD-ROM, or floppy disks, a computer system memory such as DRAM, SRAM, EDO RAM, Rambus RAM, etc., or a non-volatile memory such as a magnetic media, e.g., a hard drive, or optical storage. The memory medium may include other types of memory as well, or combinations thereof. In addition, the memory medium may be located in a first computer in which the programs are executed, or may be located in a second different computer that connects to the first computer over a network. In the latter instance, the second computer provides the program instructions to the first computer for execution. Also, the computer system may take various forms, including a personal computer system, mainframe computer system, workstation, network appliance, Internet appliance, personal digital assistant ("PDA"), television system or other device. In general, the term "computer system" may be broadly defined to encompass any device having a processor, which executes instructions from a memory medium.

The memory medium may be configured to store a software program for performing the computer-implemented method. The software program may be implemented in any of various ways, including procedure-based techniques, component-based techniques, and/or object-oriented techniques, among others. For example, the software program may be implemented using ActiveX controls, C++ objects, JavaBeans, Microsoft Foundation Classes ("MFC"), or other technologies or methodologies, as desired. A CPU, such as the host CPU, executing code and data from the memory medium may include a means for creating and executing the software program according to the methods described above.

Various embodiments further include receiving or storing instructions and/or data implemented in accordance with the foregoing description upon a carrier medium. Suitable carrier media include memory media or storage media such as magnetic or optical media, e.g., disk or CD-ROM, as well as signals such as electrical, electromagnetic, or digital signals, conveyed via a communication medium such as networks and/or a wireless link.

In an embodiment, the method may include altering a parameter of an instrument coupled to a process tool in response to at least one of the properties of an insulating film such as capacitance, dielectric constant, and/or thickness of the insulating film using a feedback control technique, as shown in step 78 of FIG. 7, or a feedforward control technique, as shown in step 79 of FIG. 7. The process tool may include, but is not limited to, a chemical vapor deposition ("CVD") tool, a physical vapor deposition ("PVD") tool, an atomic layer deposition ("ALD") tool, and a thermal growth tool. In this manner, a parameter of an instrument coupled to a process tool may be altered for forming the insulating film on additional substrates. The process tool may also include a process tool used for further processing of the substrate on which the measured insulating film is formed. For example, such a process tool may include a chemical-mechanical polishing ("CMP") tool. In this manner, a parameter of an instrument coupled to a process tool may be altered for further processing of the substrate on which the measured insulating film is formed. In a further embodiment, a processor as described herein may be coupled to the process tool and may be configured to alter a parameter of an instrument coupled to the process tool in response to at least one of the properties of the insulating film using a feedback control technique or a feedforward control technique.

Figure 8:
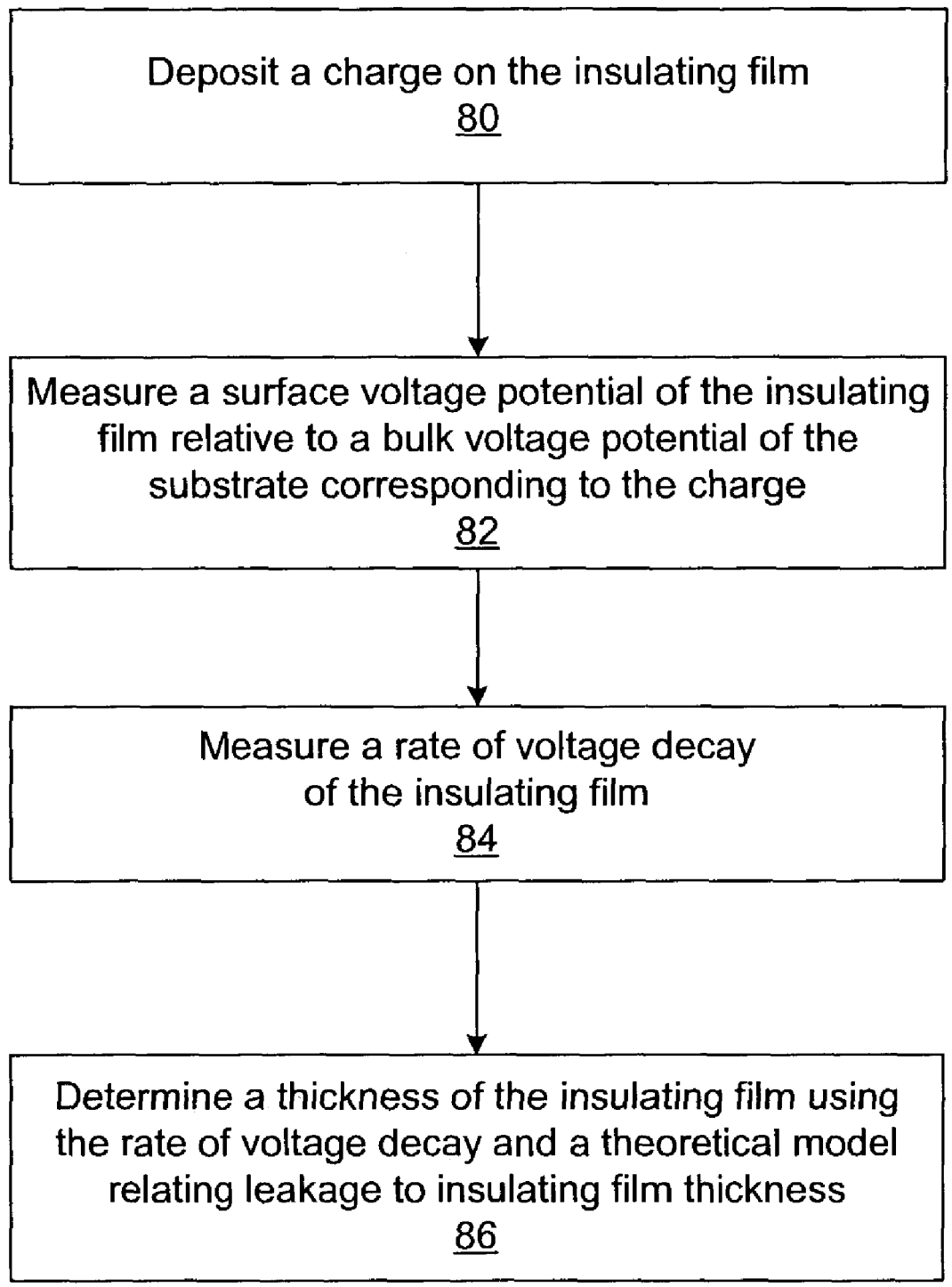
FIG. 8 depicts a flow chart illustrating an embodiment of a method for determining a thickness of an insulating film formed on a substrate.

FIG. 8 illustrates an embodiment of a method for determining a thickness of an insulating film formed on a substrate. The method may include depositing a charge on the insulating film, as shown in step 80. The charge may be deposited using a non-contacting technique as described herein. The method may also include measuring a surface voltage potential of the insulating film relative to a bulk voltage potential of the substrate corresponding to the deposited charge, as shown in step 82. The surface voltage potential may be measured using a non-contact technique as described herein. Depositing the charge and measuring the surface voltage potential may be further performed as described herein and may include any additional steps as described herein.

The method may also include measuring a rate of voltage decay of the insulating film, as shown in step 84. Measuring a rate of voltage decay may be performed as described herein. In addition, measuring a rate of voltage decay may include any additional steps described herein. The method may further include determining a thickness of the insulating film using the rate of voltage decay and a theoretical model relating leakage to insulating film thickness, as shown in step 86. The theoretical model may include any of the theoretical models as described herein. Furthermore, the method may include any additional steps as described herein.

Figure 9:
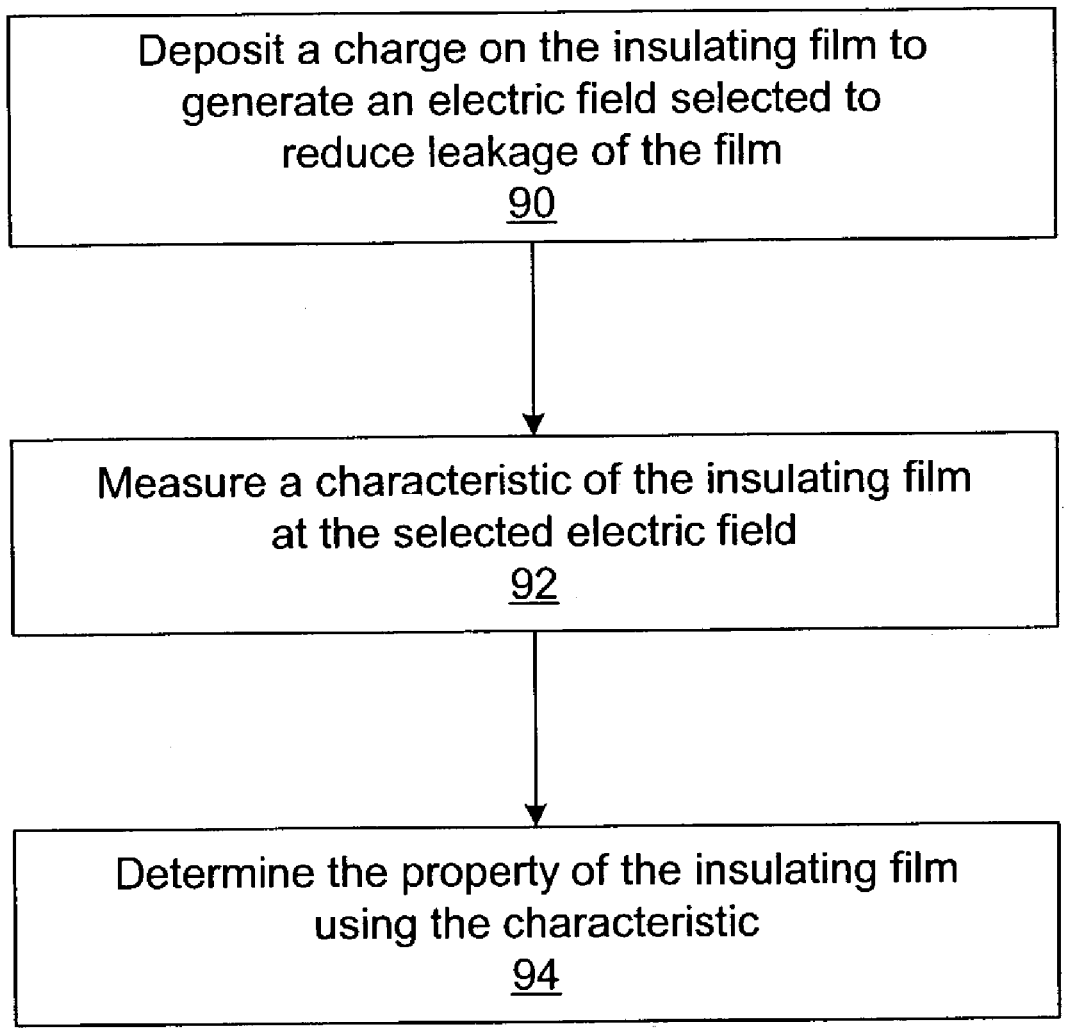
FIG. 9 depicts a flow chart illustrating an embodiment of a method for determining a property of an insulating film formed on a substrate.

FIG. 9 illustrates an embodiment of a method for determining a property of an insulating film formed on a substrate. The method may include depositing a charge on the insulating film to generate an electric field across the insulating film, as shown in step 90. The electric field may be selected to reduce leakage of the insulating film. For example, in the presence of significant leakage, a voltage or a field may be selected at which to measure and/or analyze one or more properties of an insulating film to minimize leakage effects. Upon inspection of equation 10, it is apparent that leakage may be minimized at zero voltage or electric field, which may be expressed as:

$$\lim_{V \to 0} I = 0. \quad (14)$$

For other forms of current transport, the voltage may be chosen such that an absolute magnitude of leakage may be reduced, or even minimized. For example, the electric field may be selected to be less than about 0.2 MV/cm or about 0 MV/cm. The voltage may be empirically determined or experimentally determined. For example, the selected electric field may be determined empirically using Q-V or dV/dt data. The voltage, however, will tend to occur near a voltage of about 0 for most established models of conduction through insulating films. Traditionally, measurement of insulating film capacitance or thickness are performed at fields of greater than about 0.2 MV/cm in magnitude. On highly conductive insulating films, improved performance may be achieved by performing the analysis at lower fields, or even zero-field. Such an improved performance may be particularly true for high-k and low-k material.

Q-V and C-V data was measured on an imperfectly insulating $SiO_2$ film. Less leakage was present near zero electric field across the $SiO_2$ film thereby resulting in improved performance. This reduced leakage was easily seen by a minimum (absolute value) in the slope of the C-V data at a voltage of approximately 0 V. By making measurements in this non-traditional voltage or electric field regime, the effects of leakage, whether modeled or not, may be reduced, and superior performance may be achieved.

The method may also include measuring a characteristic of the insulating film at the selected electric field, as shown in FIG. 9 as step 92. For example, measuring a characteristic may include obtaining Q-V data or C-V data for the insulating film at reduced leakage corresponding to the selected electric field or voltages. The Q-V data may be acquired from a corona based apparatus. Alternatively, the Q-V or C-V data may be acquired from a C-V plotter. In addition, the method may include determining the property of the insulating film using the characteristic, as shown in step 94.

The property may include, for example, capacitance, thickness, or dielectric constant, which may be determined as described herein. The method may include any additional steps as described herein.

The methods, as described herein, may also include a number of other steps that may increase the accuracy of measurements of insulating films on semiconductor substrates. For example, the methods may include sweeping voltages from inversion to accumulation (positive to negative on a p-type wafer or negative to positive on an n-type wafer). In this manner, the silicon may be prevented from going into a non-equilibrium condition known as deep depletion. In addition, obtaining a voltage measurement, as described herein, may include measuring the voltage in accumulation (i.e., negative voltages on a p-type wafer or positive voltages on an n-type wafer), depletion, inversion (i.e., positive voltages on a p-type wafer or negative voltages on an n-type wafer), or a combination of two or three of them. By making measurements far in accumulation or inversion, the functional dependency of the substrate potential, as described by equation 6, may become less important in theoretical analysis. By taking data both in inversion and accumulation, analysis of the data may increase the robustness of modeling parameters as described herein.

Further modifications and alternative embodiments of various aspects of the invention may be apparent to those skilled in the art in view of this description. For example, a system that may be configured to assess a property of an insulating film is provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for determining one or more properties of an insulating film formed on a substrate, comprising:
   obtaining a charge density measurement of the insulating film using a non-contact technique;
   obtaining a voltage measurement of a surface voltage potential of the insulating film relative to a bulk voltage potential of the substrate corresponding to the charge density measurement using a non-contact technique;
   obtaining a rate of voltage decay of the voltage measurement using a non-contact technique; and
   determining the one or more properties of the insulating film using the charge density measurement, the voltage measurement, and the rate of voltage decay, wherein the one or more properties comprise a thickness of the insulating film.

2. The method of claim 1, wherein the one or more properties further comprise capacitance and resistance.

3. The method of claim 1, wherein the one or more properties further comprise capacitance and resistance, the method further comprising determining a frequency dependency of a device comprising the insulating film and the substrate in the presence of current leakage through the insulating film using the capacitance and the resistance.

4. The method of claim 1, wherein the one or more properties further comprise capacitance and resistance, and wherein said determining comprises determining the thickness of the insulating film from the capacitance and the resistance.

5. The method of claim 1, wherein determining the one or more properties comprises altering the voltage measurement using the rate of voltage decay and using the altered voltage measurement and the charge density measurement to calculate the one or more properties.

6. The method of claim 1, wherein obtaining a charge density measurement comprises depositing a charge onto a surface of the insulating film, measuring the charge density of the charge, and recording the times at which the depositing and the measuring were performed.

7. The method of claim 1, wherein obtaining a voltage measurement comprises depositing a charge onto a surface of the insulating film, measuring the voltage, and recording the times at which the depositing and the measuring were performed.

8. The method of claim 1, wherein obtaining a rate of voltage decay comprises measuring the rate of voltage decay subsequent to obtaining a voltage measurement.

9. The method of claim 1, wherein obtaining a rate of voltage decay comprises measuring the rate of voltage decay prior to obtaining a voltage measurement.

10. The method of claim 1, wherein obtaining a rate of voltage decay comprises determining the rate of voltage decay using a theoretical model.

11. The method of claim 1, wherein obtaining a voltage measurement comprises measuring the voltage in accumulation, depletion, inversion, or a combination thereof.

12. The method of claim 1, wherein the one or more properties further comprise capacitance, wherein said determining comprises determining the thickness of the insulating film using the rate of voltage decay and a theoretical model relating leakage to insulating film thickness, and wherein the method further comprises determining a dielectric constant of the insulating film using the capacitance and the thickness.

13. The method of claim 1, wherein the one or more properties further comprise capacitance, the method further comprising obtaining a different thickness of the insulating film determined by an additional experimental method and determining a dielectric constant of the insulating film using the capacitance and the different thickness.

14. The method of claim 1, further comprising altering a parameter of an instrument coupled to a process tool in response to at least one of the one or more properties of the insulating film using a feedback control technique.

15. The method of claim 1, further comprising altering a parameter of an instrument coupled to a process tool in response to at least one of the one or more properties of the insulating film using a feedforward control technique.

16. A system configured to determine one or more properties of an insulating film formed on a substrate, comprising:
a measurement device configured to perform measurements on the insulating film using a non-contact technique; and
a processor coupled to the measurement device, wherein the processor is configured to:
receive input from the measurement device, wherein the input is responsive to a charge density measurement of the insulating film, a voltage measurement of a surface voltage potential of the insulating film relative to a bulk voltage potential of the substrate corresponding to the charge density measurement, and a rate of voltage decay of the voltage measurement; and
determine the one or more properties of the insulating film using the input, wherein the one or more properties comprise a thickness of the insulating film.

17. The system of claim 16, wherein the one or more properties further comprise capacitance and resistance.

18. The system of claim 16, wherein the one or more properties further comprise capacitance and resistance, and wherein the processor is further configured to determine a frequency dependency of a device comprising the insulating film and substrate in the presence of current leakage through the insulating film using the capacitance and the resistance.

19. The system of claim 16, wherein the one or more properties further comprise capacitance and resistance, and wherein the processor is further configured to determine the thickness of the insulating film from the capacitance and the resistance.

20. The system of claim 16, wherein the processor is further configured to determine the one or more properties by altering the voltage measurement using the rate of voltage decay and using the altered voltage measurement and the charge density measurement to calculate the one or more properties.

21. The system of claim 16, wherein the measurement device is further configured to deposit a charge onto a surface of the insulating film, perform the charge density measurement, and record the times at which the charge was deposited and the charge density measurement was performed.

22. The system of claim 16, wherein the measurement device is further configured to deposit a charge onto a surface of the insulating film, perform the voltage measurement, and record the times at which the charge was deposited and the voltage measurement was performed.

23. The system of claim 16, wherein the measurement device is further configured to measure the rate of voltage decay subsequent to performing the voltage measurement.

24. The system of claim 16, wherein the measurement device is further configured to measure the rate of voltage decay prior to performing the voltage measurement.

25. The system of claim 16, wherein the processor is further configured to determine the rate of voltage decay from the input using a theoretical model.

26. The system of claim 16, wherein the measurement device is further configured to perform the voltage measurement in accumulation, depletion, inversion, or a combination thereof.

27. The system of claim 16, wherein the one or more properties further comprise capacitance, wherein the processor is further configured to determine the thickness of the insulating film using the rate of voltage decay and a theoretical model relating leakage to insulating film thickness, and wherein the processor is further configured to determine a dielectric constant of the insulating film using the capacitance and the thickness.

28. The system of claim 16, wherein the one or more properties further comprise capacitance, wherein the processor is further configured to receive input responsive to a different thickness of the insulating film determined by an additional experimental method, and wherein the processor is further configured to determine a dielectric constant of the insulating film using the capacitance and the different thickness.

29. The system of claim 16, wherein the processor is further coupled to a process tool, and wherein the processor is further configured to alter a parameter of an instrument coupled to the process tool in response to at least one of the one or more properties of the insulating film using a feedback control technique.

30. The system of claim 16, wherein the processor is further coupled to a process tool, and wherein the processor is further configured to alter a parameter of an instrument coupled to the process tool in response to at least one of the one or more properties of the insulating film using a feedforward control technique.

* * * * *